US009417494B2

United States Patent
Kim et al.

(10) Patent No.: US 9,417,494 B2
(45) Date of Patent: Aug. 16, 2016

(54) DISPLAY MODULE AND DISPLAY APPARATUS HAVING THE SAME

(71) Applicant: SAMSUNG ELECTRONICS CO., LTD., Suwon-si (KR)

(72) Inventors: Jung Kyun Kim, Yongin-si (KR); Sung Ki Kim, Seoul (KR); Sru Kim, Anyang-si (KR); Jin Sub Kim, Seoul (KR); Jun Seok An, Suwon-si (KR); Kye Hoon Lee, Suwon-si (KR); Heong Seog Lee, Suwon-si (KR); Jin Hyun Cho, Seoul (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 217 days.

(21) Appl. No.: 13/724,702

(22) Filed: Dec. 21, 2012

(65) Prior Publication Data

US 2013/0162506 A1    Jun. 27, 2013

(30) Foreign Application Priority Data

Dec. 23, 2011    (KR) .................. 10-2011-0140995
Dec. 29, 2011    (KR) .................. 10-2011-0145611
Dec. 4, 2012    (KR) .................. 10-2012-0139930

(51) Int. Cl.
   *G09F 13/04*        (2006.01)
   *G09F 13/08*        (2006.01)
   (Continued)

(52) U.S. Cl.
   CPC ............ *G02F 1/13452* (2013.01); *F21V 29/20* (2013.01); *G02F 1/133603* (2013.01);
   (Continued)

(58) Field of Classification Search
CPC .... G02B 6/0083; G02B 6/0085; G02B 6/009; G02B 6/0086; G02B 6/0073; G02F 1/133615; G02F 1/133308; G02F 1/133382; G02F 1/133603; G02F 1/133608; G02F 1/133385; G02F 1/13452; G02F 2001/133628; H05K 1/0204; H05K 1/0209; H05K 1/0203; H05K 7/20963; F21V 29/20; G06F 1/32; G09F 13/0413

USPC ................... 362/612, 632, 600, 97.1, 249.02, 362/249.01, 613, 611, 234, 227; 349/58, 349/65, 69, 60, 161, 149

See application file for complete search history.

(56) References Cited

U.S. PATENT DOCUMENTS

2006/0274252 A1    12/2006    Son
2007/0139575 A1    6/2007    Wang
(Continued)

FOREIGN PATENT DOCUMENTS

EP      2 169 458 A1    3/2010
JP      2009-158125 A    7/2009

OTHER PUBLICATIONS

Communication, dated May 17, 2013, issued by the European Patent Office in counterpart European Patent Application No. 12197915.7.
(Continued)

*Primary Examiner* — Donald Raleigh
*Assistant Examiner* — Kevin Quarterman
(74) *Attorney, Agent, or Firm* — Sughrue Mion, PLLC

(57) ABSTRACT

A display module including a backlight to more effectively dissipate heat generated at light emitting diodes (LEDs) and heat dissipation units to effectively dissipate heat generated at driver chips and prevent movement of the driver chips by attaching porous fillers to the heat dissipation units, and a display apparatus having the same are provided. The display module includes a display panel, a backlight disposed on a rear side of the display panel and including a plurality of printed circuit boards, a bottom chassis adapted to accommodate the backlight unit and provided with a plurality of seating grooves, a driving printed circuit board, a plurality of flexible printed circuit films which electrically connect the display panel and the driving printed circuit board, at least one heat dissipater disposed on an opposite surface of a corresponding one of the flexible printed circuit and provided with a porous filler.

32 Claims, 9 Drawing Sheets

(51) Int. Cl.
  *G02F 1/1345* (2006.01)
  *G06F 1/32* (2006.01)
  *F21V 29/00* (2015.01)
  *H05K 7/20* (2006.01)
  *G02F 1/1335* (2006.01)
  *G02F 1/1333* (2006.01)

(52) U.S. Cl.
  CPC .............. *G06F1/32* (2013.01); *G09F 13/0413* (2013.01); *H05K 7/20963* (2013.01); *G02F 1/133385* (2013.01); *G02F 1/133608* (2013.01); *G02F 2001/133628* (2013.01)

(56) References Cited

U.S. PATENT DOCUMENTS

| | | |
|---|---|---|
| 2007/0171354 A1 | 7/2007 | Yuge |
| 2008/0106911 A1* | 5/2008 | Park et al. ............. 362/612 |
| 2008/0218662 A1 | 9/2008 | Toyama et al. |
| 2010/0165237 A1* | 7/2010 | Jung ................. 349/58 |
| 2011/0043721 A1* | 2/2011 | Hwang et al. ............ 349/58 |
| 2011/0170017 A1 | 7/2011 | Liu |
| 2011/0170034 A1* | 7/2011 | Jeong ................. 349/61 |
| 2012/0008337 A1* | 1/2012 | Yu ................. 362/606 |
| 2012/0050636 A1* | 3/2012 | Jeong et al. ............. 349/58 |
| 2012/0294042 A1* | 11/2012 | Sung et al. ............. 362/612 |
| 2013/0039078 A1* | 2/2013 | Lee et al. ............. 362/382 |

OTHER PUBLICATIONS

International Search Report (PCT/ISA/210), dated Mar. 29, 2013, issued by the International Searching Authority in counterpart International Patent Application No. PCT/KR2012/011096.

* cited by examiner

DISPLAY MODULE AND DISPLAY APPARATUS HAVING THE SAME

CROSS-REFERENCE TO RELATED APPLICATION(S)

This application claims priority from Korean Patent Application No. 2011-0140995, filed on Dec. 23, 2011, Korean Patent Application No. 2011-0145611, filed on Dec. 29, 2011, and Korean Patent Application No. 2012-0139930, filed on Dec. 4, 2012 in the Korean Intellectual Property Office, the disclosures of which are incorporated herein by reference.

BACKGROUND

1. Field

Exemplary embodiments relate to a display module including a display panel to display images through liquid crystals and a backlight unit to irradiate the display panel with light, and a display apparatus having the same.

2. Description of the Related Art

A display module, which is generally a device including a display panel to display images, is used in a wide range of display applications including monitors and televisions.

Among the display modules, those employing a liquid display panel have been widely used.

Recently, in order to achieve slim design, light weight and lower power consumption, a flat panel display device has been developed as a replacement for cathode ray tubes.

A representative example of the flat panel display device is a liquid crystal display (LCD) device, which displays images using electrical and optical characteristics of liquid crystals.

The LCD device is provided with a liquid crystal display panel to optically display images, and a backlight unit to supply light to the liquid crystal display panel.

The liquid crystal display panel is a device which displays images optically by applying a voltage to the liquid crystals sealed between two transparent substrates so as to change the direction of alignment of the liquid crystal molecules to adjust the light transmittance.

Since the liquid crystal display panel does not emit light itself, the display module includes a backlight unit disposed at the rear side of the liquid crystal display panel to irradiate the liquid crystal display panel with light.

It is a recent trend to use backlight units employing printed circuit boards and light emitting diodes (LEDs) mounted on the printed circuit boards to emit light.

As a light source of the backlight unit, the cold cathode fluorescent lamp (CCFL) has been used, but today the LED is predominantly used as it is more advantageous than the CCFL in terms of weight, thickness, power consumption, color range, switching time, service life, and the like.

Depending on positions at which the LEDs, the light emitting sources, are disposed, the backlight units are divided into edge-lit backlight units and direct back light units.

The edge-lit backlight units have the LEDs disposed at the edge of the liquid crystal display panel, while the direct backlight units have the LEDs disposed throughout the entire rear surface of the liquid crystal display panel.

For the direct backlight units, a flexible printed circuit film, on which a driver integrated circuit (IC) is mounted, is positioned between a middle mold and top chassis formed of plastics since the backlight units structurally increase product thickness.

If a flexible printed circuit film is positioned between a middle mold and top chassis formed of plastics as above, heat generated at the driver IC may not be dissipated, leading to an overall increase in temperature.

SUMMARY

Therefore, it is an aspect of an exemplary embodiment to provide a display module including a backlight unit which may more efficiently dissipate heat generated at light emitting diodes (LEDs), and a display apparatus having the same.

It is another aspect of an exemplary embodiment to provide a display module including a heat dissipation unit which allows heat generated at a driver IC to be more efficiently dissipated, and a display apparatus having the same.

Additional aspects of the exemplary embodiments will be set forth in part in the description which follows and, in part, will be obvious from the description, or may be learned by practice of the exemplary embodiments.

According to an aspect of an exemplary embodiment, a display module includes a display panel, a backlight disposed on a rear side of the display panel and including a plurality of printed circuit boards, each of which extends in one direction and includes a plurality of light emitting diodes on a front surface thereof which irradiate the display panel with light, a bottom chassis adapted to accommodate the backlight unit and includes a plurality of seating grooves extending in a longitudinal direction to allow the printed circuit boards to be seated therein, a driving printed circuit board which supplies a drive signal to the display panel, a plurality of flexible printed circuit films which electrically connect the display panel and the driving printed circuit board, a driver chip mounted on one surface of each of the flexible printed circuit films, at least one heat dissipater disposed on an opposite surface of a corresponding one of the flexible printed circuit films which dissipates heat generated at the driver chip of the corresponding one of the flexible printed circuit films and provided with a porous filler attached therein.

The printed circuit boards may be disposed in parallel spaced apart from each other, and the seating grooves may be arranged in parallel to correspond to the printed circuit boards.

The display module may further include at least one connection substrate to connect at least two of the printed circuit boards to each other, wherein the bottom chassis may include at least one connection substrate seating groove which connects the seating grooves to each other and in which the at least one connection substrate is seated.

The bottom chassis may be formed in a rectangular shape, wherein the seating grooves may be formed to be parallel to a longer side of the bottom chassis, and the connection substrate seating groove may be formed to be parallel to a shorter side of the bottom chassis.

The bottom chassis may be formed in a rectangular shape, wherein the seating grooves may be formed to be parallel to a shorter side of the bottom chassis, and the connection substrate seating groove may be formed to be parallel to a longer side of the bottom chassis.

The display module may further include a heat dissipation portion disposed on a rear surface of at least one of the printed circuit boards and adjoins an inner surface of a corresponding one of the seating grooves, wherein heat from the printed circuit boards is transferred to the bottom chassis through the heat dissipation portion.

A depth of the seating grooves may not be greater than a sum of a thickness of the printed circuit boards and a thickness of the heat dissipation portion.

The heat dissipation portion may include a graphite sheet.

The heat dissipation portion may include an aluminum heat sink plate.

The printed circuit boards may include or be formed of a resin material, and each of the printed circuit boards may include, on a front surface thereof, with a metal layer for heat dissipation.

The display module may further include a lens disposed on at least one of the light emitting diodes to diffuse light generated by the at least one of the light emitting diodes.

A middle mold which supports the display panel may be disposed on a rear surface of the display panel, and a top chassis fixed to the middle mold may be disposed on a front surface of the display panel, and the display panel and the backlight may be spaced apart from each other by the middle mold.

The middle mold and the top chassis may include or be formed of a plastic material, and the flexible printed circuit films may be positioned between the middle mold and the top chassis.

The at least one heat dissipater may be disposed such that one surface of the heat dissipater contacts the top chassis, and an opposite surface of the heat dissipater contacts the flexible printed circuit films.

The at least one heat dissipater includes a plurality of heat dissipaters disposed respectively on the flexible printed circuit films.

Each of the plurality of the heat dissipaters may include a first adhesive sheet one surface of which is adhered to the top chassis, a porous filler adhered to an opposite surface of the first adhesive sheet, a second adhesive sheet adhered to a top of the porous filler, a metal sheet adhered to a top of the second sheet to dissipate heat generated at the driver chip, and a heat radiation sheet with which a top of the metal sheet is coated.

The porous filler may be provided to prevent damage of components due to vibrations, and movement of the driver chip may be prevented by the porous filler.

The porous filler may include or be formed of polyurethane foam, and a flame retardant that may be applied to a surface of the porous filler to suppress burning of the porous filler.

The metal sheet may comprises aluminum or be an aluminum sheet.

According to another aspect of an exemplary embodiment, a display apparatus includes the display module described above, a power supply board which supplies power to the display panel and the plurality of printed circuit boards and which is disposed on a rear side of the display module, a signal processing board which processes an image signal externally received and transmits the image signal to the display panel, a case which accommodates the display module, the power supply board, and the signal processing board.

According to another aspect of an exemplary embodiment, a display module includes a display panel, a backlight disposed on a rear side of the display panel, and a bottom chassis which accommodates the backlight, wherein the backlight includes a plurality of printed circuit boards, each of which extends in one direction and includes a plurality of light emitting diodes on a front surface thereof to irradiate the display panel with light, the bottom chassis includes a plurality of seating grooves extending in a longitudinal direction, and the printed circuit boards are respectively seated in the seating grooves.

According to another aspect of an exemplary embodiment, a display module includes a display panel, a middle mold disposed on a rear surface of the display panel which supports the display panel, a top chassis disposed on a front surface of the display panel and fixed to the middle mold, a driving printed circuit board which supplies a drive signal to the display panel, a plurality of flexible printed circuit films which electrically connect the display panel and the driving printed circuit board, a driver chip being mounted on one surface of each of the flexible printed circuit films, at least one heat dissipater disposed on an opposite surface of a corresponding one of the flexible printed circuit films which dissipates heat generated at the driver chip of the corresponding one of the flexible printed circuit films and including a porous filler attached therein.

According to another aspect of an exemplary embodiment, a display module includes: at least one flexible printed circuit film which is connectable to a display panel and a driving printed circuit board; a driver chip disposed on one surface of each of the at least one flexible printed circuit film; and at least one heat dissipater, disposed on a surface of each of the at least one flexible printed circuit film, wherein the at least one heat dissipater dissipates heat generated at the driver chip.

Each of the at least one heat dissipater may include a porous filler attached therein.

Each of the at least one heat dissipater may include a first adhesive sheet, a second adhesive sheet, a metal sheet and a heat radiation sheet, wherein one surface of the first adhesive sheet is attachable to a top chassis of a display apparatus, the porous filler is adhered to an opposite surface of the first adhesive sheet, the second adhesive sheet adhered to a top of the porous filler, the metal sheet adhered to a top of the second sheet to dissipate heat generated at the driver chip, and the heat radiation sheet coats a top of the metal sheet.

The porous filler may include a polyurethane foam and a flame retardant that is applied to a surface of the porous filler to suppress burning of the porous filler. The metal sheet may include aluminum.

According to another aspect of an exemplary embodiment, a display module includes: a backlight including a plurality of printed circuit boards, each of which extends in one direction, and a plurality of light emitting diodes disposed on a front of the backlight; and a heat dissipation portion disposed on a rear surface of at least one of the plurality of printed circuit boards, wherein heat from the printed circuit boards is transferred to a bottom chassis through the heat dissipation portion.

The plurality of printed circuit boards may be disposed in parallel spaced apart from each other.

The display module may also include at least one connection substrate to connect at least two of the plurality of printed circuit boards to each other.

The heat dissipation portion may include a graphite sheet. The heat dissipation portion may include an aluminum heat sink plate.

The plurality of printed circuit boards inlclude a resin material, and each of the plurality of printed circuit boards may comprise, on a front surface thereof, a metal layer for heat dissipation.

BRIEF DESCRIPTION OF THE DRAWINGS

These and/or other aspects of the exemplary embodiments will become apparent and more readily appreciated from the following description of the exemplary embodiments, taken in conjunction with the accompanying drawings of which.

DETAILED DESCRIPTION

Figure 1:
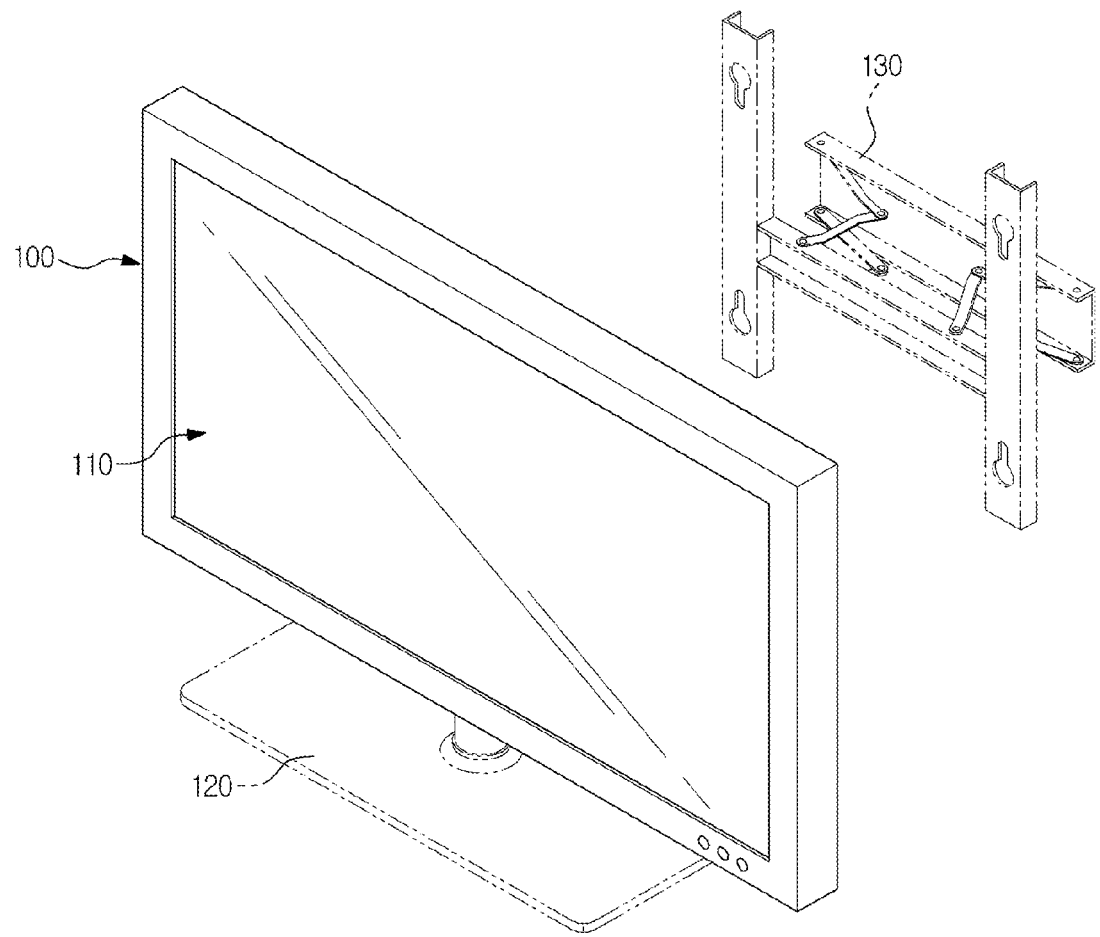
FIG. 1 is a perspective view illustrating a display apparatus according to an exemplary embodiment.

Reference will now be made in detail to the exemplary embodiments, examples of which are illustrated in the accompanying drawings, wherein like reference numerals refer to like elements throughout.

As shown in FIG. 1, a display apparatus includes a case 100 forming an outer appearance of the display apparatus, and a display module 110 accommodated in the case 100 to display an image. The display apparatus may be set on the top of a shelf through a stand 120 or mounted on a wall through a bracket 130 fixed to the wall.

Figure 2:
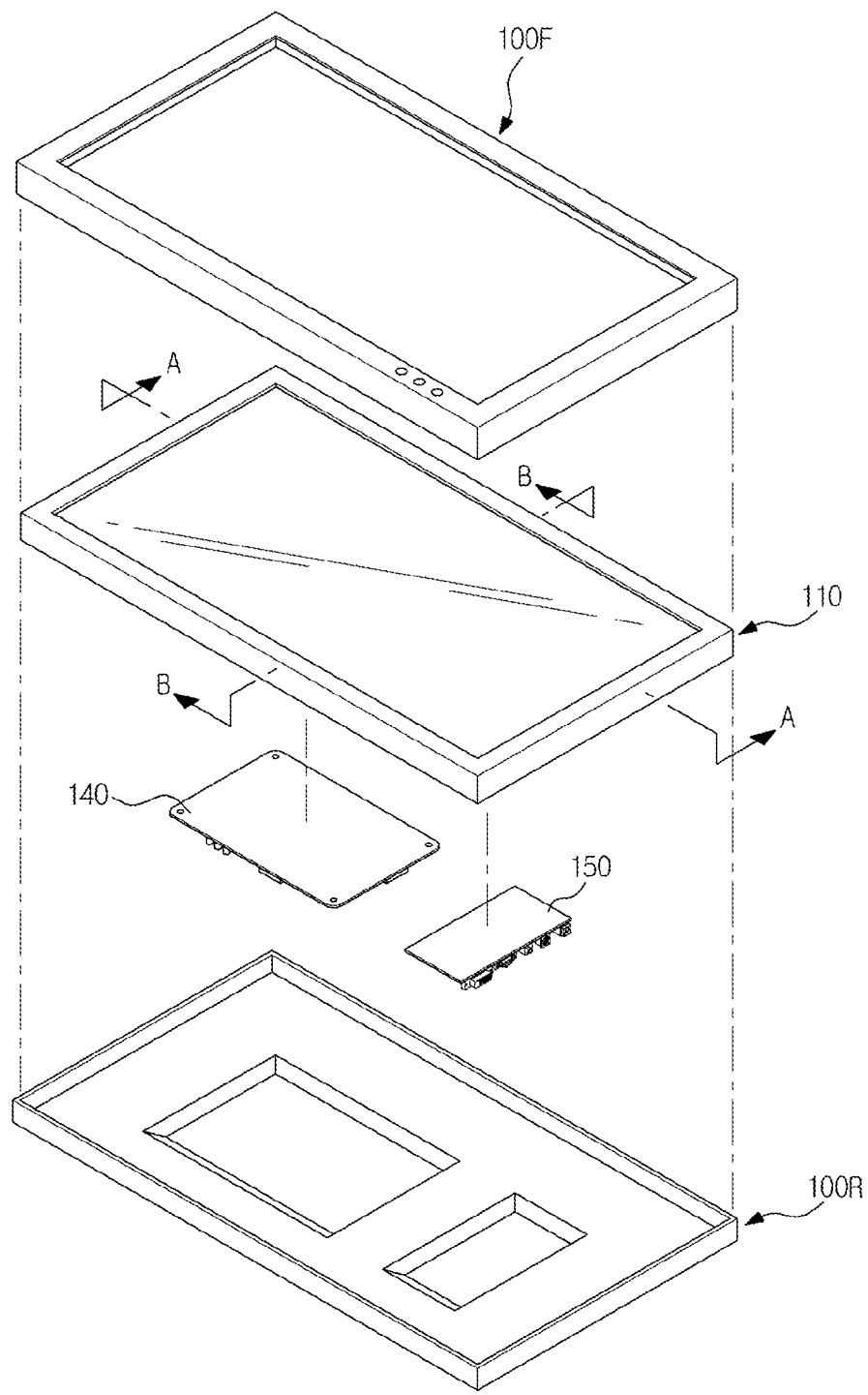
FIG. 2 is an exploded perspective view illustrating the display apparatus of FIG. 1.

As shown in FIG. 2, the case 100 includes a front case 100F and a rear case 100R which are coupled to face each other with the display module 110 disposed in between.

Disposed on the rear side of the display module 110 are a power supply board 140 to supply power, and a signal processing board 150 provided with various input terminals to receive and process an external image signal and transmit the image signal to a display panel 10, which will be described later. A hole, which is not shown, is provided at a bottom chassis 50 to install a wire to interconnect the signal processing board 150 and the display panel 10, and the power supply board 140 and the signal processing board 150 are covered by the rear case 100R so as not to be exposed.

Figure 3:
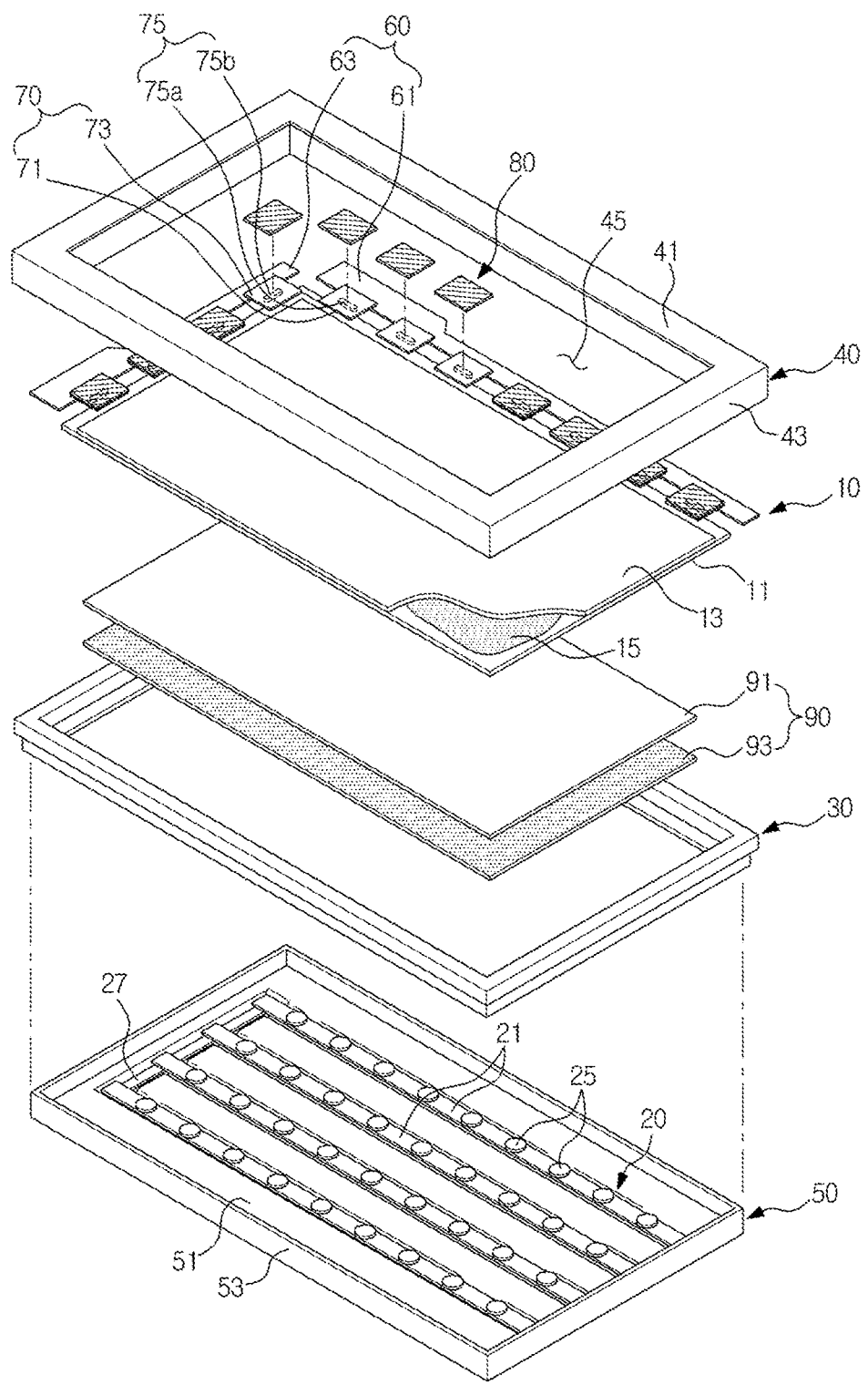
FIG. 3 is an exploded perspective view illustrating a display module applied to the display apparatus of FIG. 1.

As shown in FIG. 3, the display module 110 includes a display panel 10, a backlight unit 20 (e.g., a backlight, a backlight circuit, etc.) disposed under the display panel 10 to be spaced apart from the display panel 10, a middle mold 30 to support and space apart the display panel 10 and the backlight unit 20, a top chassis 40 and a bottom chassis 50 disposed respectively on the display panel 10 and under the backlight unit 20, and a driving printed circuit board 60 to supply a drive signal to the display panel 10, a plurality of flexible printed circuit films 70 to electrically connect the display panel 10 and the driving printed circuit board 60, each of the flexible printed circuit films 70 having a driver chip 75 mounted on one surface thereof, and a heat dissipation unit 80 (e.g., a heat dissipater, a heat dissipation component, etc.) disposed on the opposite surface of each of the flexible printed circuit films 70 to dissipate heat generated at the driver chip 75.

The display panel 10 is a liquid crystal display panel with liquid crystals, and includes a thin film transistor (TFT) substrate 11 having TFTs formed thereon, a color filter substrate 13 facing the TFT substrate 11, and liquid crystals 15 provided between the TFT substrate 11 and the color filter substrate 13.

The TFT substrate 11 is a transparent glass substrate on which the TFTs are formed in a matrix shape as switching elements.

For each of the TFTs, a data line is connected to the source terminal, a gate line is connected to the gate terminal, and a pixel electrode formed of a transparent conductive material is connected to the drain terminal.

The color filter substrate 13 is a substrate which is disposed to face the TFT substrate 11 spaced a certain distance from the color filter substrate 13, and has RGB color pixels (red, green and blue pixels) which are formed in the thin film process and adapted to reveal predetermined colors when light is transmitted therethrough.

A common electrode formed of a transparent conductive material is provided on the front surface of the color filter substrate 13.

In the display panel 10 having a configuration as above, when power is applied to the gate terminal of the TFT, an electric field is formed between the pixel electrode and the common electrode, and alignment of the liquid crystals 15 interposed between the TFT substrate 11 and the color filter substrate 13 is changed by the electric field.

Since the display panel 10 may form an image with adjustment of the alignment of the liquid crystals 15 but does not produce light itself, the display panel 10 is supplied with light from the backlight unit 20 positioned on the rear surface of the display panel 10 to display images.

Figure 4:
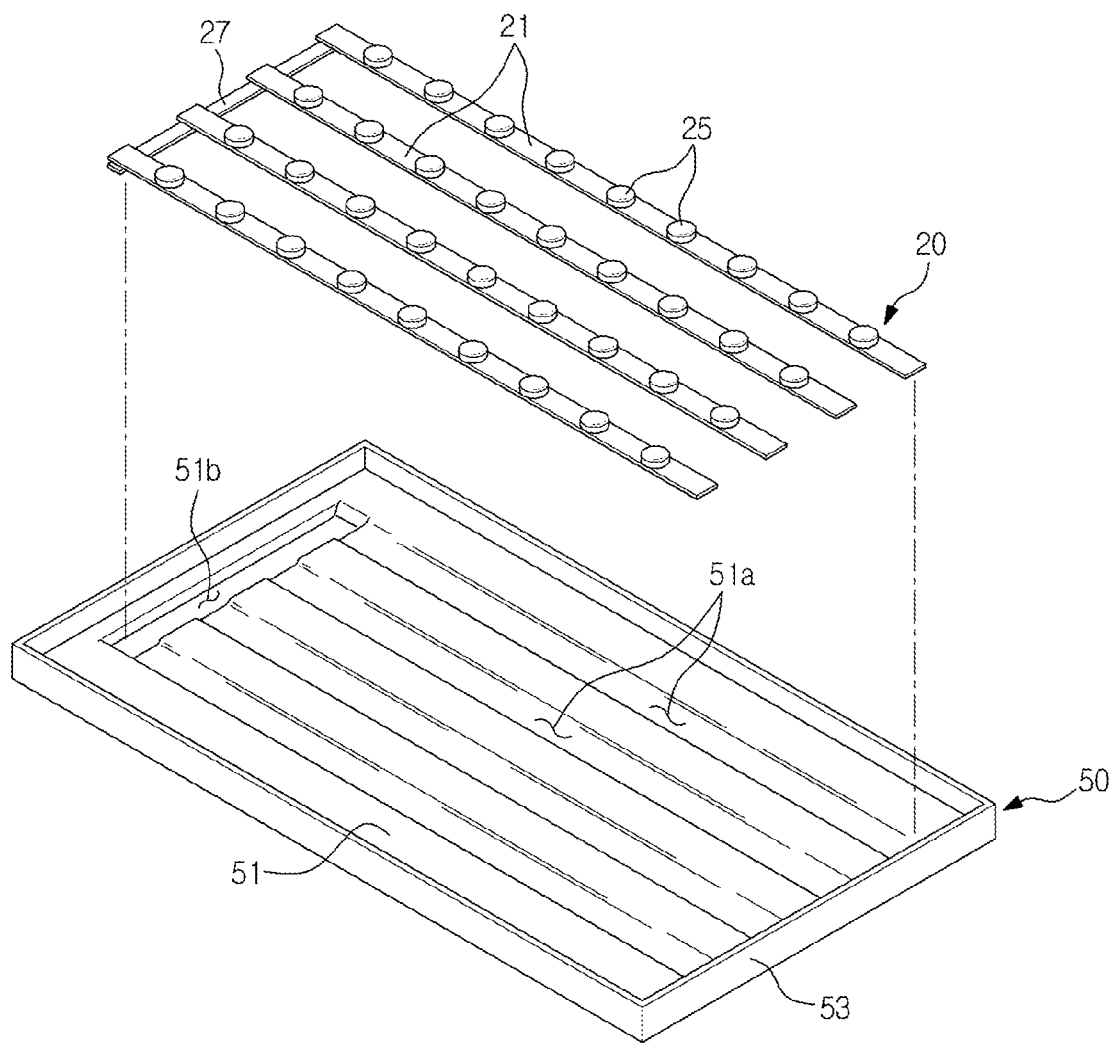
FIG. 4 is an exploded perspective view illustrating installation of a backlight unit of the display apparatus according to an exemplary embodiment.
Figure 5:
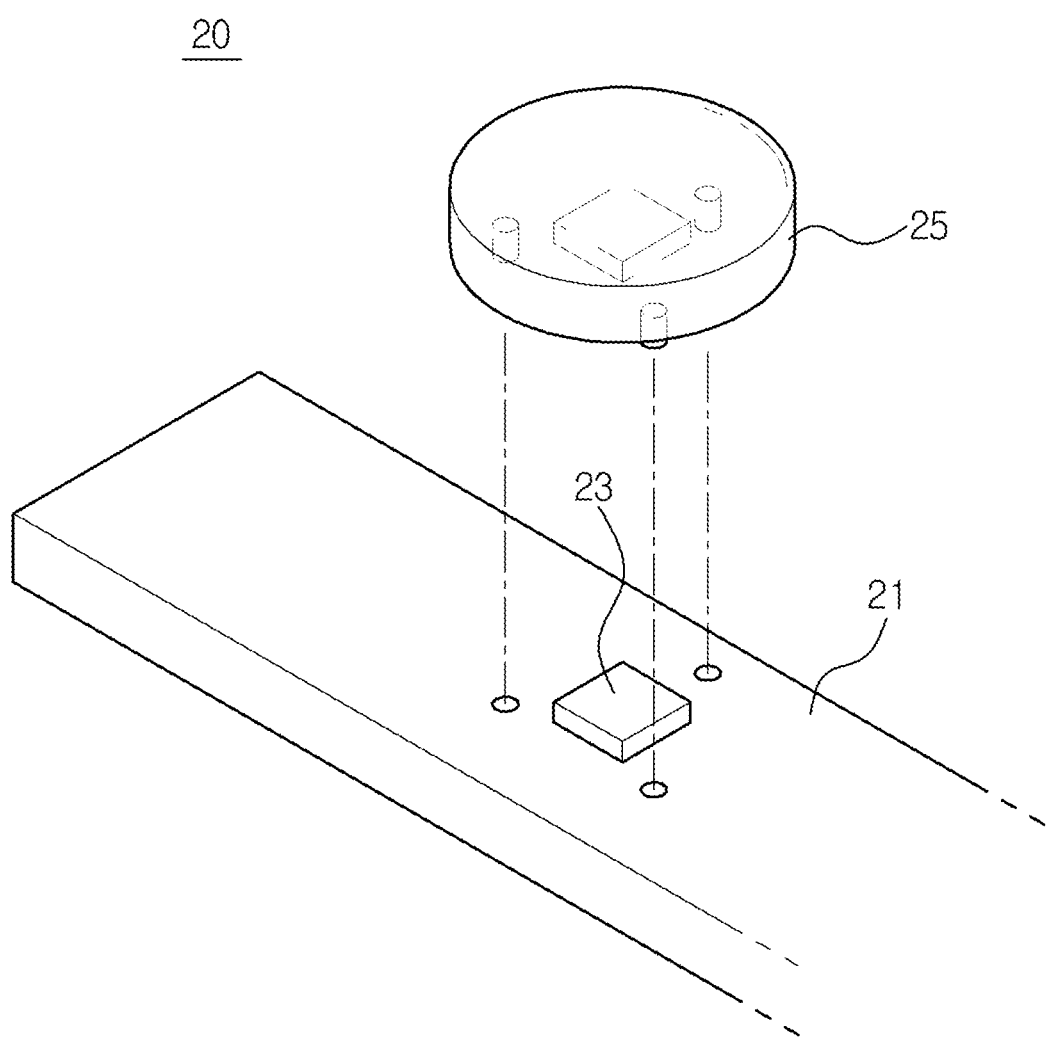
FIG. 5 is an exploded perspective view illustrating a circuit board and a light emitting diode applied to the display module of the display apparatus according to an exemplary embodiment.
Figure 6:
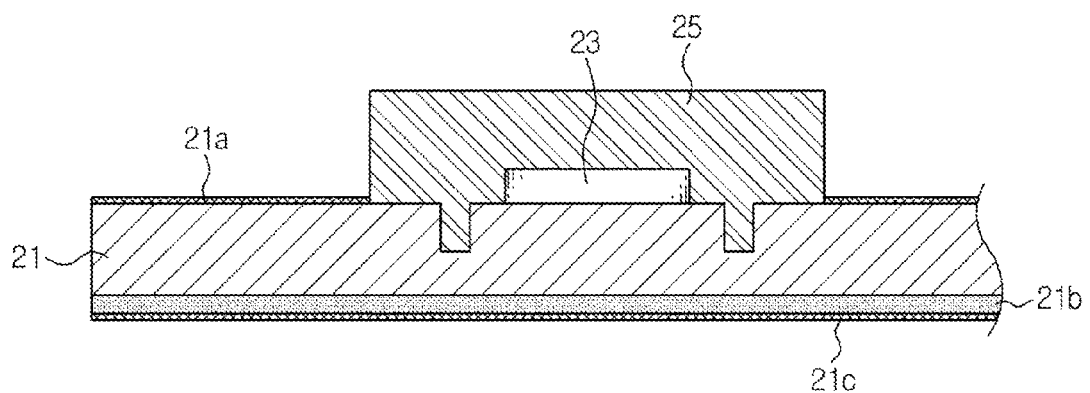
FIG. 6 is a cross-sectional view illustrating the circuit board and light emitting diode applied to the display module of the display apparatus according to an exemplary embodiment.

As shown in FIGS. 4 to 6, the backlight unit 20 includes printed circuit boards 21 having a conductive pattern formed thereon and disposed on the rear side of the display panel 10, light emitting diodes (LEDs) 23 mounted on the front surface of the printed circuit boards 21 to face the rear surface of the display panel 10, and circular lenses 25 installed respectively on the LEDs 23 to diffuse light generated by the LEDs 23.

In the illustrated exemplary embodiment, a plurality of printed circuit boards 21 are disposed in parallel spaced apart from each other, each of the printed circuit boards 21 extending in one direction to have a length corresponding to the display panel 10. A connection substrate 27 is disposed at one ends of the printed circuit boards 21 to connect the one ends of the printed circuit boards 21 to each other to allow the printed circuit boards 21 to operate in connection with each other through the connection substrate 27.

A plurality of LEDs 23 is arranged in the longitudinal direction of the printed circuit boards 21 and spaced apart from each other, and a plurality of lenses 25 is provided to be installed respectively at the LEDs 23. In addition, a metal layer 21a formed of a metal such as a copper which has a high heat transfer performance is disposed on the front surface of each of the printed circuit boards 21 on which the LEDs 23 are mounted.

As shown in FIG. 3, optical sheets 90 are disposed between the display panel 10 and the backlight unit 20 to improve optical characteristics of light with which the backlight unit 20 irradiates the display panel 10. In the illustrated exemplary embodiment, the optical sheets 90 include a diffusion sheet 91 to diffuse light radiated from the backlight unit 20 to improve brightness uniformity, and a light collecting sheet 93 to direct the light diffused by the diffusion sheet 91 to the display panel 10 such that the light enters the display panel 10 in a direction perpendicular to the display panel 10.

A top chassis 40, which may be formed of a plastic material, may be provided with a bezel surrounding the edge of the display panel 10, and a top side portion 43 bent at the end of the bezel 41. The bezel 41 represents a portion having a width corresponding to the distance from the outer line of the display panel 10 to the active area of the display panel 10 where an image is really displayed. Formed on the front surface of the top chassis 40 is an opening 45 which allows the active area of the display panel 10 to be exposed on the front surface of the top chassis 40.

The bottom chassis 50, which is formed in a roughly rectangular shape, includes a bottom face 51 at which the backlight unit 20 is seated, and a bottom side portion 53 extending upward from the periphery of the bottom face 51. The bottom chassis 50 is formed of a thermally conductive metallic material to dissipate heat transferred from the LEDs 23.

Also, the bottom chassis 50 is provided with a plurality of seating grooves 51a formed in a shape corresponding to that of the printed circuit boards 21 to allow the printed circuit boards 21 to be seated at the seating grooves 51a. A concave connection substrate seating groove 51b in the shape corresponding to that of the connection substrate 27 is provided at one side of the seating grooves 51a. Since the printed circuit boards 21 are disposed in parallel and spaced apart from each other as described above, the seating grooves 51a are arranged in parallel spaced apart from each other, and the connection substrate seating groove 51b extends perpendicular to the seating grooves 51a to connect one side of each seating groove 51a to each other. Thus, the printed circuit boards 21 and connection substrate 27 are seated at and supported by the bottom chassis 50 through the seating grooves 51a and connection substrate seating groove 51b, without any additional component. In the illustrated exemplary embodiment, the seating grooves 51a are formed in parallel with the longer side of the bottom chassis 50, and the connection substrate seating groove 51b is formed in parallel with the shorter side of the bottom chassis 50.

The middle mold 30, which may be formed of a plastic material, supports the display panel 10 and optical sheets 90 and is supported by the bottom chassis 50, as shown in FIGS. 3 and 6 to 8. The display panel 10 and the optical sheets 90 are placed between the top chassis 40 and middle mold 30 to be supported by the top chassis 40 and middle mold 30.

For the display module 110 having a structure as above, since a plurality of printed circuit boards 21 on which the LEDs 23 are mounted extend to correspond to the display panel 10, the printed circuit boards 21 may need to be provided in large quantity and with a large area, thereby causing increase in production cost.

Therefore, the printed circuit boards 21 formed by printing conductive patterns on a substrate of a resin material, which is less expensive than a metal, are used for the backlight unit 20, but they fail to disperse heat due to nature of the resin material, and accordingly heat transferred from the LEDs 23 to the printed circuit boards 21 are not dispersed and the temperature at the portions of the printed circuit boards 21 where the LEDs 23 are mounted is higher than that of other portions of the printed circuit boards 21.

Accordingly, heat dissipation portions 21b are provided at the rear surfaces of the printed circuit boards 21 to facilitate dissipation of heat transferred from the LEDs 23 to the printed circuit boards 21. The heat dissipation portions 21b extend in the longitudinal direction of the printed circuit boards 21 to correspond to the printed circuit boards 21, and are disposed at the rear surface of the printed circuit boards 21 to adjoin the inner surface of the seating grooves 51a provided at the bottom chassis 50. Here, the heat dissipation portions 21b are formed to be shorter than the printed circuit boards 21 so that the heat dissipation portions 21b are not disposed where the printed circuit boards 21 are connected with the connection substrate 27, thereby allowing the printed circuit boards 21 to directly contact the connection substrate 27.

In the illustrated exemplary embodiment, the seating grooves 51a at which the printed circuit boards 21 and heat dissipation portions 21b are seated are formed to have a depth not greater than the sum of the thicknesses of the printed circuit board 21 and the heat dissipation portion 21b.

In the illustrated exemplary embodiment, the heat dissipation portions 21b are provided with graphite sheets formed of a graphite material which serve to disperse heat in the longitudinal direction of the printed circuit boards 21. Accordingly, the heat transferred from the printed circuit boards 21 disperses through the graphite sheet in the longitudinal direction of the printed circuit boards 21 and then is transferred to the seating grooves 51a in the bottom chassis 50 and dissipated.

The printed circuit boards 21, which may be disposed on the rear surface of the printed circuit boards 21 in various ways including coating, adhesion and application, are seated together with the printed circuit boards 21 in the seating grooves 51a.

Since the heat transferred to the rear surface of the printed circuit boards 21 disperses along the heat dissipation portions 21b in the longitudinal direction of the printed circuit boards 21 and then dissipates to the bottom chassis 50 through the seating grooves 51a adjoining the heat dissipation portions 21b, heat dissipates effectively and thereby temperature differences among the locations on the printed circuit boards 21 are lowered.

A supplementary layer 21c to supplement the function of the heat dissipation portions 21b is formed on the surface of the heat dissipation portions 21b which is shaped in a sheet. In the illustrated exemplary embodiment, the supplementary layer 21c includes an insulation layer formed of an electrical insulation material to insulate the heat dissipation portions 21b or an auxiliary heat dissipation layer formed of a material having a higher thermal conductivity than the heat dissipation portions 21b to boost the effect of heat dissipation by the heat dissipation portions 21b.

In the illustrated exemplary embodiment, the seating grooves 51a are formed to be parallel to the longer side of the bottom chassis 50, and the connection substrate seating groove 51b are formed to be parallel to the shorter side of the bottom chassis 50, but exemplary embodiments are not limited thereto. It may be possible that the seating grooves 51a are formed to be parallel to the shorter side of the bottom chassis 50, while the connection substrate seating groove 51b are formed to be parallel to the longer side of the bottom chassis 50.

In the illustrated exemplary embodiment, the heat dissipation portions 21b include a graphite sheet, but exemplary embodiments are not limited thereto. The heat dissipation portions 21b may include an aluminum heat sink plate. The aluminum heat sink plate not only disperses the heat transferred from the printed circuit boards 21 to the printed circuit boards 21, but also serves to dissipate the heat.

As shown in FIG. 3, the driving printed circuit board 60 is positioned at the periphery of the display panel 10 to supply a drive signal to the display panel 10 to drive the display panel 10 to display an image.

The driving printed circuit board 60 includes a gate driving printed circuit board 61 to supply a scan signal to the gate line of the display panel 10 and a data driving printed circuit board 63 to supply a data signal to the data line.

A plurality of flexible printed circuit films 70 is provided to electrically connect the display panel 10 and the driving printed circuit board 60 to apply a drive signal supplied from the driving printed circuit board 60 to the display panel 10.

The flexible printed circuit films 70 include gate flexible printed circuit films 71 to connect the display panel 10 and the gate driving printed circuit board 61 and data flexible printed circuit films 73 to connect the display panel 10 and the data driving printed circuit board 63, and a plurality of gate flexible printed circuit films 71 and a plurality of data flexible printed circuit films 73 are provided.

The gate flexible printed circuit films 71 and data flexible printed circuit films 73 are formed of tape carrier packages (TCPs) or chip on films (COFs), and a driver IC is mounted, as the driver chip 75, on each of the gate flexible printed circuit films 71 and data flexible printed circuit films 73 to control the timing of a drive signal to apply the drive signal provided by the gate driving printed circuit board 61 or the data driving printed circuit board 63 to the display panel 10 with a proper timing.

The driver chip 75 includes a gate driver chip 75a mounted on the gate flexible printed circuit films 71 and a data driver chip 75b mounted on the data flexible printed circuit films 73.

Figure 7:
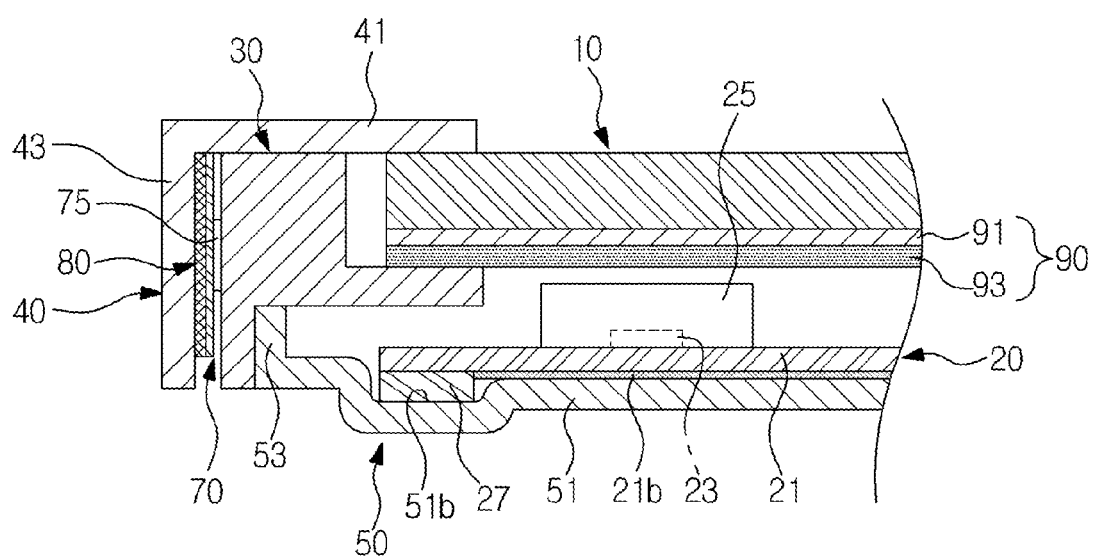
FIG. 7 is a partial cross-sectional view, taken along line A-A of FIG. 2.
Figure 8:
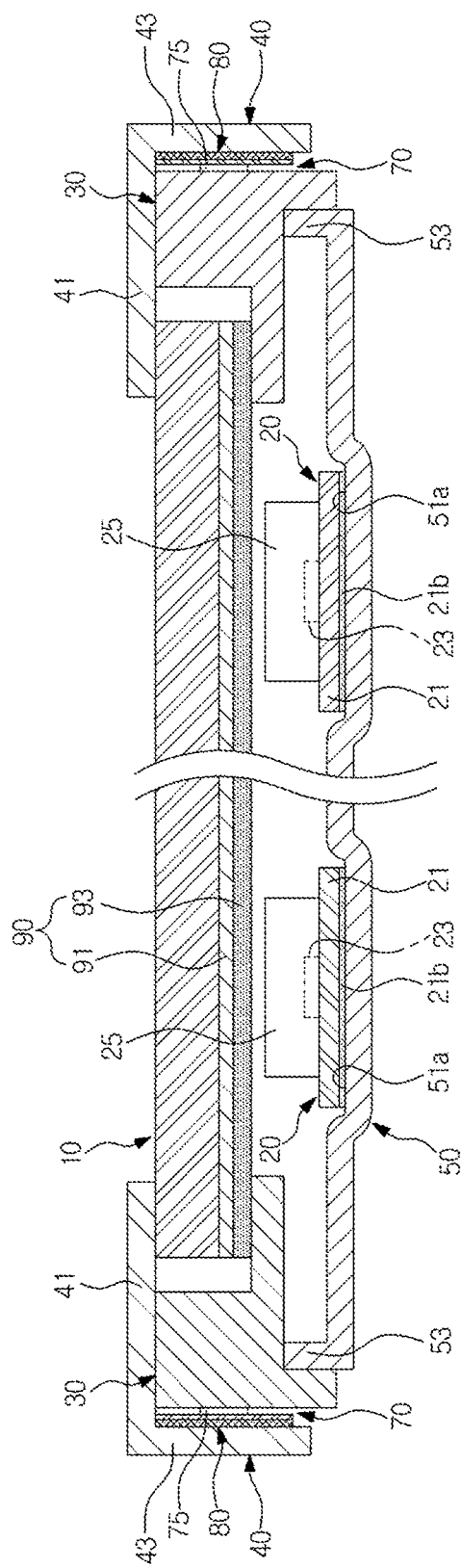
FIG. 8 is a cross-sectional view, taken along line B-B of FIG. 2.

If the backlight unit 20 is a direct backlight unit that structurally increases product thickness, the flexible printed circuit films 70 with the driver chip 75 mounted thereon are positioned between the middle mold 30 and top chassis 40, which are formed of a plastic material, as shown in FIGS. 7 and 8.

If the flexible printed circuit films 70 are positioned between the middle mold 30 and top chassis 40 formed of a plastic material, which has a low thermal conductivity, the heat generated at the driver chip 75 fails to dissipate, thereby leading to an increase in temperature.

Accordingly, a heat dissipation unit 80 is disposed on the surface of the flexible printed circuit films 70 opposite to the one on which the driver chip 75 is mounted, in order to dissipate the heat generated at the driver chip 75.

Figure 9:
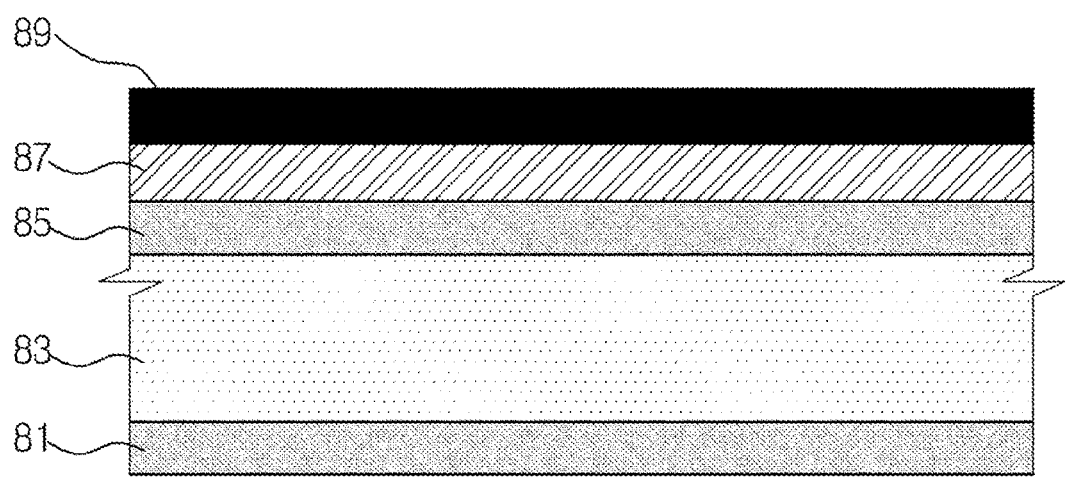
FIG. 9 is a cross-sectional view illustrating a heat dissipation unit of the display apparatus according to an exemplary embodiment.

As shown in FIG. 9, a plurality of heat dissipation units 80 are provided to be disposed respectively on the flexible printed circuit films 70, and each of the heat dissipation units 80 includes a first adhesive sheet 81 having one surface adhered to the top chassis 40, a porous filler 83 to be adhered to the opposite surface of the first adhesive sheet 81, a second adhesive sheet 85 to be adhered to the top of the porous filler 83, a metal sheet 87 to be adhered to the top of the second adhesive sheet 85, and a heat radiation sheet 89 with which the top of the metal sheet 87 is coated.

FIG. 9 illustrates that a plurality of heat dissipation units 80 is provided to be disposed at the respective flexible printed circuit films 70, but the heat dissipation units 80 may be integrally configured.

For the heat dissipation units 80 having a configuration as above, the first adhesive sheet 81 is adhered to the top chassis 40, and the heat radiation sheet 89 is disposed on the surface of the flexible printed circuit film 70 opposite to the one on which the driver chip 75 is mounted to contact the flexible printed circuit film 70.

The porous filler 83 is formed of a polyurethane foam and contains pores therein to absorb shock to prevent damage of the components due to vibrations. Also, movement of the driver chip 75 may be prevented by the porous filler 83.

Since the middle mold 30 and top chassis 40 positioned on both sides of the heat dissipation units 80 are formed of a plastic material, which may be easily burned by heat, a flame retardant may be applied to the surface of the porous filler 83 to suppress burning by heat.

The metal sheet 87, which is intended to dissipate the heat generated at the driver chip 75, may be formed of a metal such as aluminum which has high thermal conductivity.

By coating the upper portion of the metal sheet 87 with the heat radiation sheet 89, the heat generated at the driver chip 75 may be more effectively dissipated.

Although a few exemplary embodiments have been shown and described, it would be appreciated by those skilled in the art that changes may be made in these exemplary embodiments without departing from the principles and spirit of the inventive concept, the scope of which is defined in the claims and their equivalents.

What is claimed is:

1. A display module comprising:
   a display panel;
   a backlight disposed on a rear side of the display panel and comprising a plurality of printed circuit boards, each of the plurality of the printed circuit boards extending in one direction and comprising a plurality of light emitting diodes on a front surface thereof which irradiate the display panel with light;
   a bottom chassis comprising a plurality of seating grooves extending in a longitudinal direction to allow the plurality of printed circuit boards to be seated therein;
   a driving printed circuit board which supplies a drive signal to the display panel;
   a plurality of flexible printed circuit films which electrically connect the display panel and the driving printed circuit board;
   a driver chip mounted on one surface of each of the plurality of flexible printed circuit films; and
   at least one heat dissipater disposed on an opposite surface of a corresponding one of the plurality of flexible printed circuit films which dissipates heat generated at the driver chip of the corresponding one of the plurality of flexible printed circuit films,
   wherein the at least one heat dissipater comprises a plurality of heat dissipaters disposed respectively on the plurality of flexible printed circuit films, and
   wherein each of the at least one heat dissipater is formed to a first adhesive sheet comprising two surfaces, each of the two surfaces of the first adhesive sheet comprises an adhesive.

2. The display module according to claim 1, wherein:
   the plurality of printed circuit boards are disposed in parallel spaced apart from each other; and
   the plurality of seating grooves are arranged in parallel to correspond to the plurality of printed circuit boards.

3. The display module according to claim 1, further comprising at least one connection substrate which connects at least two of the plurality of printed circuit boards to each other,
   wherein the bottom chassis comprises at least one connection substrate seating groove which connects the plurality of seating grooves to each other and in which the at least one connection substrate is seated.

4. The display module according to claim 3, wherein the bottom chassis is formed in a rectangular shape, wherein:
   the plurality of seating grooves are formed to be parallel to a longer side of the bottom chassis; and
   the connection substrate seating groove is formed to be parallel to a shorter side of the bottom chassis.

5. The display module according to claim 3, wherein the bottom chassis is formed in a rectangular shape, wherein:
   the plurality of seating grooves are formed to be parallel to a shorter side of the bottom chassis; and
   the connection substrate seating groove is formed to be parallel to a longer side of the bottom chassis.

6. The display module according to claim 1, further comprising a heat dissipation portion disposed on a rear surface of at least one of the plurality of printed circuit boards and adjoins an inner surface of a corresponding one of the plurality of seating grooves, wherein heat from the plurality of printed circuit boards is transferred to the bottom chassis through the heat dissipation portion.

7. The display module according to claim 6, wherein a depth of the plurality of seating grooves is not greater than a sum of a thickness of the plurality of printed circuit boards and a thickness of the heat dissipation portion.

8. The display module according to claim 6, wherein the heat dissipation portion comprises a graphite sheet.

9. The display module according to claim 6, wherein the heat dissipation portion comprises an aluminum heat sink plate.

10. The display module according to claim 3, wherein the plurality of printed circuit boards comprise a resin material, and each of the plurality of printed circuit boards comprise, on a front surface thereof, with a metal layer for heat dissipation.

11. The display module according to claim 1, further comprising a lens disposed on at least one of the plurality of light emitting diodes to diffuse light generated by the at least one of the plurality of light emitting diodes.

12. The display module according to claim 1, wherein a middle mold which supports the display panel is disposed on a rear surface of the display panel, and a top chassis fixed to the middle mold is disposed on a front surface of the display panel, and the display panel and the backlight are spaced apart from each other by the middle mold.

13. The display module according to claim 12, wherein the middle mold and the top chassis comprise a plastic material, and the plurality of flexible printed circuit films are positioned between the middle mold and the top chassis.

14. The display module according to claim 13, wherein the at least one heat dissipater is disposed such that one surface of the heat dissipater contacts the top chassis, and an opposite surface of the heat dissipater contacts the plurality of flexible printed circuit films.

15. The display module according to claim 14,
wherein each of the plurality of the heat dissipaters comprises the first adhesive sheet with one surface of the two surfaces of the first adhesive sheet being adhered to the top chassis, a porous filler adhered to an opposite surface of the one surface of the first adhesive sheet, a second adhesive sheet adhered to a top of the porous filler, a metal sheet adhered to a top of the second sheet to dissipate heat generated at the driver chip, and a heat radiation sheet with which a top of the metal sheet is coated.

16. The display module according to claim 15, wherein the porous filler is provided to prevent damage of components due to vibrations, and movement of the driver chip is prevented by the porous filler.

17. The display module according to claim 16, wherein the porous filler is comprises polyurethane foam and a flame retardant that is applied to a surface of the porous filler to suppress burning of the porous filler.

18. The display module according to claim 15, wherein the metal sheet comprises aluminum.

19. A display apparatus comprising:
the display module according to claim 1;
a power supply board which supplies power to the display panel and the plurality of printed circuit boards and which is disposed on a rear side of the display module;
a signal processing board which processes an image signal externally received and transmits the image signal to the display panel;
a case which accommodates the display module, the power supply board, and the signal processing board.

20. A display module comprising:
a display panel;
a backlight disposed on a rear side of the display panel; and
a bottom chassis which accommodates the backlight,
wherein:
the backlight comprises a plurality of printed circuit boards, each of the plurality of the printed circuit boards extending in one direction and comprising a plurality of light emitting diodes on a front surface thereof which irradiate the display panel with light;
the bottom chassis comprises a plurality of seating grooves extending in a longitudinal direction; and
the printed circuit boards are respectively seated in the plurality of seating grooves, and
wherein the display module further comprises a plurality of heat dissipaters disposed respectively on the plurality of flexible printed circuit boards, and
wherein each of the plurality of heat dissipaters is formed to a first adhesive sheet comprising two surfaces, each of the two surfaces of the first adhesive sheet comprises an adhesive.

21. A display module comprising:
a display panel;
a middle mold disposed on a rear surface of the display panel which supports the display panel;
a top chassis disposed on a front surface of the display panel and fixed to the middle mold;
a bottom chassis comprising a plurality of seating grooves extending in a longitudinal direction;
a driving printed circuit board which supplies a drive signal to the display panel;
a plurality of flexible printed circuit films which electrically connect the display panel and the driving printed circuit board;
a driver chip being mounted on one surface of each of the plurality of flexible printed circuit films; and
at least one heat dissipater disposed on an opposite surface of a corresponding one of the plurality of flexible printed circuit films which dissipates heat generated at the driver chip of the corresponding one of the plurality of flexible printed circuit films and comprising a porous filler attached therein,
wherein the at least one heat dissipater comprises a plurality of heat dissipaters disposed respectively on the plurality of flexible printed circuit films, and
wherein each of the at least one heat dissipater is formed to a first adhesive sheet comprising two surfaces, each of the two surfaces of the first adhesive sheet comprises an adhesive.

22. A display module comprising:
a plurality of flexible printed circuit films which is connectable to a display panel and a driving printed circuit board;
a driver chip disposed on one surface of each of the plurality of flexible printed circuit films;
at least one heat dissipater, disposed on a surface of each of the plurality of flexible printed circuit films; and
a chassis provided at a bottom surface thereof with a plurality of seating grooves,
wherein the at least one heat dissipater dissipates heat generated at the driver chip,
wherein the at least one heat dissipater comprises a plurality of heat dissipaters disposed respectively on the plurality of flexible printed circuit films, and wherein each of the at least one heat dissipater is formed to a first adhesive sheet comprising two surfaces, each of the two surfaces of the first adhesive sheet comprises an adhesive.

23. The display module according to claim 22, wherein each of the at least one heat dissipater comprises a porous filler attached therein.

24. The display module according to claim 23,
wherein each of the at least one heat dissipater comprises the first adhesive sheet, a second adhesive sheet, a metal sheet and a heat radiation sheet, and
wherein one surface of the two surfaces of the first adhesive sheet is attachable to a top chassis of a display apparatus, the porous filler is adhered to an opposite surface of the first adhesive sheet, the second adhesive sheet is adhered to a top of the porous filler, the metal sheet is adhered to a top of the second adhesive sheet to dissipate heat generated at the driver chip, and the heat radiation sheet coats a top of the metal sheet.

25. The display module according to claim 24, wherein the porous filler comprises a polyurethane foam and a flame retardant that is applied to a surface of the porous filler to suppress burning of the porous filler.

26. The display module according to claim 24, wherein the metal sheet comprises aluminum.

27. A display module comprising:
a backlight comprising a plurality of printed circuit boards, each of which extends in one direction, and a plurality of light emitting diodes disposed on a front of the backlight;
a chassis provided at a bottom surface thereof with a plurality of seating grooves; and
a heat dissipation portion disposed on a rear surface of at least one of the plurality of printed circuit boards, wherein heat from the printed circuit boards is transferred to a bottom chassis through the heat dissipation portion,
wherein the heat dissipation portion comprises a plurality of heat dissipaters disposed respectively on the plurality of printed circuit boards, and
wherein each of the plurality of heat dissipaters is formed to a first adhesive sheet comprising two surfaces, each of the two surfaces of the first adhesive sheet comprises an adhesive.

28. The display module according to claim 27, wherein the plurality of printed circuit boards are disposed in parallel spaced apart from each other.

29. The display module according to claim 27, further comprising:
at least one connection substrate to connect at least two of the plurality of printed circuit boards to each other.

30. The display module according to claim 27, wherein the heat dissipation portion comprises a graphite sheet.

31. The display module according to claim 27, wherein the heat dissipation portion comprises an aluminum heat sink plate.

32. The display module according to claim 27, wherein the plurality of printed circuit boards comprise a resin material, and each of the plurality of printed circuit boards comprises, on a front surface thereof, a metal layer for heat dissipation.

* * * * *